United States Patent [19]

Rosenberger et al.

[11] 3,808,041

[45] Apr. 30, 1974

[54] PROCESS FOR THE PRODUCTION OF A MULTILAYER METALLIZATION ON ELECTRICAL COMPONENTS

[75] Inventors: Georg Rosenberger, Ottobrunn; Heinrich Sohlbrand, Munich, both of Germany

[73] Assignee: Siemens Aktiengesellschaft, Berlin, Germany

[22] Filed: Mar. 11, 1971

[21] Appl. No.: 123,173

[30] Foreign Application Priority Data

Mar. 13, 1970 Germany ........................... 2012110

[52] U.S. Cl. .................... 117/217, 117/62, 117/215, 117/212, 117/221, 317/234 M

[51] Int. Cl. .............................................. B44d 1/18

[58] Field of Search ........ 317/234 M; 117/217, 212, 117/221, 62, 215; 96/36.2

[56] References Cited

UNITED STATES PATENTS

| | | | |
|---|---|---|---|
| 2,694,016 | 11/1954 | Craven et al. | 117/221 |
| 2,805,965 | 9/1957 | Robinson | 117/221 |
| 3,067,315 | 12/1962 | Hurko | 117/217 |
| 3,186,084 | 6/1965 | Betteridge et al. | 117/217 |
| 3,287,612 | 11/1966 | Lepselter | 317/234 M |
| 3,460,003 | 8/1969 | Hampikian et al. | 317/234 M |
| 3,616,348 | 6/1968 | Greig | 317/234 M |
| 3,622,322 | 11/1971 | Brill | 96/36.2 |
| 3,549,415 | 12/1970 | Capek et al. | 117/217 |
| 3,635,759 | 1/1972 | Howatt | 117/217 |

*Primary Examiner*—Cameron K. Weiffenbach
*Attorney, Agent, or Firm*—Herbert L. Lerner

[57] ABSTRACT

The present invention relates to a method of producing a multilayer metallization on electrical components. Each individual metal which is dissolved in the form of a compound, in an organic varnish, is applied on the surface of the substrate wafer. Each varnish layer is dried prior to the application of another varnish layer. The successively applied varnish layers are then converted into a single step, by heating, into the pure metal layers.

The method is particularly suitable for producing multilayer contacts consisting of platinum, gold and titanium, on semiconductor crystal surfaces.

4 Claims, 5 Drawing Figures

PROCESS FOR THE PRODUCTION OF A MULTILAYER METALLIZATION ON ELECTRICAL COMPONENTS

The present invention relates to a method for producing a fast adhering, contactable metallization on surfaces of electric circuit components, such as silicon planar semiconductor components, which comprises the steps of applying a solution containing a metal compound upon the surface to be metallized; evaporating the liquid of the solution and converting the remaining layer, which contains the metal compound, into a pure metal layer by heating and subsequently sintering or alloying the layer with the semiconductor surface.

One of the last production steps in a system for producing electrical components, more particularly microsemiconductor components, according to the planar or the mesa techniques, is the application of emitter or base contacts or conductor paths. This is effected by providing a wafer of semiconductor material, e.g., a silicon monocrystal wafer, and providing a plurality of component systems thereon by vapor deposition using appropriate masks or stencils, with the desired metal, e.g., aluminum or its alloys, silver, gold, platinum, chromium or molybdenum, which is thereafter divided into individual components.

If, due to the small sizes, vapor deposition by means of a mask is no longer possible, the metal layer is applied over the whole area and an appropriate photo resist or varnish is applied. The desired structure is produced by exposing and developing the photo varnish after which the metal layer is peeled off from the undesired localities of the semiconductor system. In addition to metal vapor depositing, it is also possible to apply the metallization of a semiconductor surface by cathode sputtering or with the aid of a galvanic solution. These methods require a considerable expenditure in equipment and furthermore have the disadvantage that the metallizations thus produced are not excellent with respect to their adhesiveness and their layer thickness on the semiconductor surface, thus making the contactability more difficult. This results in mechanical and electrical breakdowns in the thus produced semiconductor circuit components.

It is an object of the present invention to improve the adhesiveness and thus the contactability of metallizations comprising aluminum alloys on semiconductor surfaces and at the same time to provide a method which works rationally and without entailing a great output.

We produce a metallization consisting of a plurality of layers of various metals by applying a solution in the form of a metal compound or suspension dissolved in an organic varnish. A drying process is carried out between the application of the individual varnish layers that contain the metal compounds. Subsequently, the varnish layers applied, successively, during a single heating step, are converted at 350° – 400°C in an atmosphere containing oxygen and argon, into the pure metal layers and the superimposed metal layers are alloyed with the semiconductor surface.

It is within the frame work of the invention to utilize a photolighographic etching process prior to, or following the aforementioned single heating step, for obtaining the multilayer metal layer. Performing the photoetching technique prior to such heating step offers the advantage that during the development process, the lowerlying varnish portions, which contain the metals, will also be removed. When photoetching is carried out following the heating step, various solvents which must be adjusted to the respective metal layer must be used to remove the individual metal layers and to expose the substrate surface.

The liquid with which the metal compound is used may be nitrocellulose dissolved in a butylacetate/ether mixture.

Another possibility is to use, initially, a photosensitive varnish (photoresist) as the suspension or solvent, for the metal compound, in lieu of the nitrocellulose, dissolved in a butylacetate/ether mixture.

According to a preferred embodiment of the invention, the concentration of the metal compound in the varnish is 5 to 10 percent by weight. The drying of the individual varnish layers, containing the respective metal compound, is preferably effected at 100° to 150°C, for a maximum of 5 minutes.

The layer thickness of the individual varnishes containing the metal compounds, is 3 – 4 $\mu$ so that the layer thickness for the individual metal layers, following the single heating step, will be 0.1 to 0.3 $\mu$.

The use of an organic varnish, according to the invention, will result in particularly uniform coating thicknesses, over the entire semiconductor surface to be coated. Accordingly, this leads to uniform metal layers. The use of photo varnishes results in very finely detailed metal, down to a width of one one-thousandth mm, using the known method steps of the photo technique with subsequent heating.

According to a particularly preferred embodiment of the invention, a multilayer metal structure consisting of gold and platinum, may be obtained using chloroauric acid $HAuCl_4 \cdot 4H_2O$) or gold-dimethylacetylacetonate for the gold compound and chloroplatinic acid ($H_2PtCl_6$) for the platinum compound. If a titanium layer must also be applied, or used as an intermediate layer, it was found expedient to use dicyclopentadienyltitanium, for the titanium compound.

The method according to the teaching of the invention may be applied to particular advantage for producing multilayer contacts comprising platinum, gold and titanium on exposed semiconductor crystal surfaces, coated with masking or protective layers ($SiO_2$, $Al_2O_3$, $Si_3N_4$). It may also be used in the presence of photoresist coatings. The multilayer structures produced according to this method, are particularly suited, due to the uniformity of their layer thicknesses and their good electrical conductivity, for the production of semiconductor components, more particularly for use in planar and beam-lead technology.

The invention will be explained in greater detail in an embodiment with reference to FIGS. 1 to 5, which schematically illustrate the sequence of steps in the production of a multilayer metallization, for example, titanium/gold/platinum.

Figure 1:
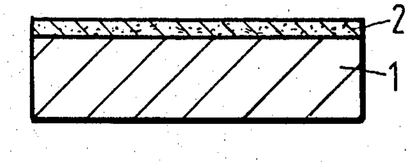
FIG. 1 is a schmatic, sectional view showing a substrate on which a varnish film is disposed.
Figure 2:
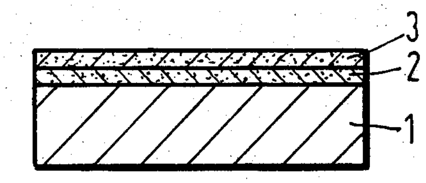
FIG. 2 is a schematic, sectional view showing a substrate with two layers of varnish film.
Figure 3:
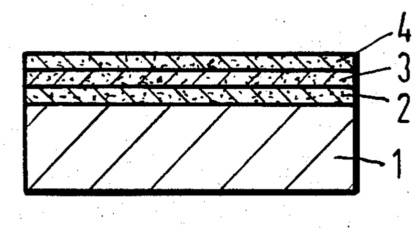
FIG. 3 is a view similar to FIGS. 1 and 2 but showing three layers of varnish film on the substrate.

In FIG. 1, a nitrocellulose/ether/butyl-acetate varnish containing dicyclopentadienyltitanium in a concentration of 5 to 10 percent, was sprayed on a silicon semiconductor body and centrifuged for 15 seconds at 2,000 rpm. The varnish film 2 thus had a layer thickness of 3 $\mu$. Following drying of the varnish film at 100°C for a period of 5 minutes, a second varnish film layer 3, shown in FIG. 2 and containing the platinum compound, chloroplatinic acid, was applied in the same manner and was also dryed. Now, as illustrated in FIG. 3, in order to produce a third metal film a third varnish layer 4, which contains dissolved chloroauric acid or gold dimethylacetalacetonate, was applied and also subjected to a short drying process at 100°C.

Figure 4:
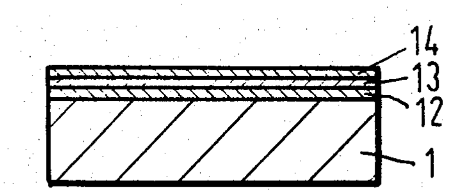
FIG. 4 is a schematic, sectional view showing the substrate with the metallization.

The three varnish layers were converted into pure metal layers by subjecting the entire arrangement to a heating step, in an oxygen/argon atmosphere, at 350° to 400°C, for about 10 minutes. During this heating, the varnish components and the metal components dissociate. The pure metallization remains on the substrate surface. The metallization consists of titanium layer 12, platinum layer 13 and a gold layer 14, shown in FIG. 4. The individual layer thicknesses was 0.1 to 0.3 $\mu$.

Figure 5:
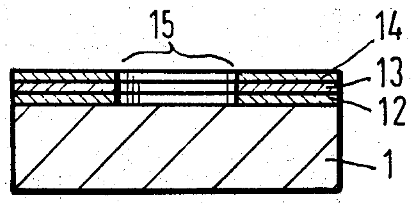
FIG. 5 is a view similar to FIG. 4 but showing the exposure of the substrate surface to a phototechnique.

FIG. 5 shows the exposure of the substrate surface in region 15, within the framework of a photo technology, whereby structuring of the metallization comprising a multilayer metal layer (12,13,14) was carried out on the silicon substrate 1. Using the appropriate metal compounds in the varnish, one may obtain a different composition for the multilayer metallization. It is possible to superimpose only two layers, e.g., platinum and gold or titanium and platinum, or even more than three layers. It is important that, after each application of a varnish layer containing metal, the varnish layer be subjected to a drying process.

The sintering or alloying of the multilayer metal layer with the semiconductor body is carried out in accordance with known methods in a tubular or continuous furnace, at temperatures of 500° to 700°C.

We claim:

1. A method of producing a multilayered electrical contact on the surface of a silicon planar transistor, said method comprising (1) applying a plurality of layers successively to said silicon surface, each layer comprising a different metal compound suspended in an organic binder, (2) drying each individual binder layer, (3) thereafter heating the sucessively applied layers at 350°–400°C in an atmosphere containing oxygen and argon to convert said layers into pure metal layers and (4) alloying the superimposed metal layers with the semiconductor surface.

2. The method of claim 1, wherein the drying of each individual binder layer is effected at 100° – 150°C for 5 minutes.

3. The method of claim 1, wherein one metal compound is selected from the group consisting of chloroauric acid and gold dimethylacetylacetonate.

4. The method of claim 1, wherein the thickness of each individual binder layer prior to said heating step is 3 – 4 $\mu$.

* * * * *